US012256649B2

(12) United States Patent
Majkic et al.

(10) Patent No.: US 12,256,649 B2
(45) Date of Patent: Mar. 18, 2025

(54) QUALITY CONTROL OF HIGH PERFORMANCE SUPERCONDUCTOR TAPES

(71) Applicant: University of Houston System, Houston, TX (US)

(72) Inventors: Goran Majkic, Houston, TX (US); Venkat Selvamanickam, Houston, TX (US)

(73) Assignee: University of Houston System, Houston, TX (US)

( * ) Notice: Subject to any disclaimer, the term of this patent is extended or adjusted under 35 U.S.C. 154(b) by 0 days.

(21) Appl. No.: 18/509,125

(22) Filed: Nov. 14, 2023

(65) Prior Publication Data

US 2024/0172567 A1    May 23, 2024

Related U.S. Application Data

(60) Continuation of application No. 17/865,860, filed on Jul. 15, 2022, now abandoned, which is a division of (Continued)

(51) Int. Cl.
*H10N 60/01* (2023.01)
*H10N 60/20* (2023.01)
*H10N 60/85* (2023.01)

(52) U.S. Cl.
CPC ..... *H10N 60/0632* (2023.02); *H10N 60/0464* (2023.02); *H10N 60/203* (2023.02); *H10N 60/857* (2023.02); *Y02E 40/60* (2013.01)

(58) Field of Classification Search
CPC .............................. H10N 60/0632
See application file for complete search history.

(56) References Cited

U.S. PATENT DOCUMENTS

| 5,229,360 A | 7/1993 | Shiga |
| 5,447,569 A | 9/1995 | Hiskes |

(Continued)

FOREIGN PATENT DOCUMENTS

| CN | 1488174 A | 4/2004 |
| CN | 1864062 A | 11/2006 |

(Continued)

OTHER PUBLICATIONS

Hikawa, K. et al. "Superconducting Properties and Microstructures in GdBa2Cu3Oy Thin Films with Straight BaHfO3 Nanorods Introduced." Journal of Cryogenics and Superconductivity Society of Japan, 2014, vol. 49, No. 3, pp. 99-104.

(Continued)

*Primary Examiner* — Paul A Wartalowicz
(74) *Attorney, Agent, or Firm* — Blank Rome LLP (57) ABSTRACT

A superconductor tape and method for manufacturing, measuring, monitoring, and controlling same are disclosed. Embodiments are directed to a superconductor tape which includes a superconductor film overlying a buffer layer which overlies a substrate. In one embodiment, the superconductor film is defined as having a c-axis lattice constant higher than 11.74 Angstroms. In another embodiment, the superconductor film comprises $BaMO_3$, where M=Zr, Sn, Ta, Nb, Hf, or Ce, and which has a (101) peak of $BaMO_3$ elongated along an axis that is between 60° to 90° from an axis of the (001) peaks of the superconductor film. These and other embodiments achieve well-aligned nanocolumnar defects and thus a high lift factor, which can result in superior critical current performance of the tape in, for example, high magnetic fields.

5 Claims, 11 Drawing Sheets

Related U.S. Application Data application No. 16/329,658, filed as application No. PCT/US2017/049087 on Aug. 29, 2017, now Pat. No. 11,393,970.

(60) Provisional application No. 62/381,369, filed on Aug. 30, 2016.

(56) References Cited

U.S. PATENT DOCUMENTS

| | | | |
|---|---|---|---|
| 5,696,392 | A | 12/1997 | Char |
| 5,885,939 | A | 3/1999 | Matsunaga |
| 2004/0023810 | A1 | 2/2004 | Ignatiev |
| 2004/0127064 | A1 | 7/2004 | Ihara |
| 2005/0014653 | A1 | 1/2005 | Reeves |
| 2008/0176749 | A1 | 7/2008 | Goyal |
| 2012/0035056 | A1 | 2/2012 | Aytug |
| 2013/0331272 | A1 | 12/2013 | Selvamanickam |
| 2016/0172080 | A1 | 6/2016 | Selvamanickam |

FOREIGN PATENT DOCUMENTS

| | | | |
|---|---|---|---|
| JP | 2001247311 | A | 9/2001 |
| JP | 2002068894 | A | 3/2002 |
| JP | 5057784 | A | 10/2012 |
| JP | 2016522534 | A | 7/2016 |
| KR | 20050047523 | A | 5/2005 |
| WO | 0159186 | A1 | 8/2001 |
| WO | 2014209458 | A1 | 12/2014 |

OTHER PUBLICATIONS

Tsuruta, A. et al. "Dependence of BaM03 (M=Zr, Sn, Hf) Materials on Lattice Stress and Tc in BaM03-Doped SmBa2Cu30y Thin Films." Journal of Cryogenics and Superconductivity Society of Japan, vol. 50, No. 5 (2015), pp. 224-231.

Sawano, Y. et al. "Superconducting Property of BaHf03 Doped SmBa2Cu30y Films Prepared by Alternating-targets Technique on IBAD-MgO." Physics Procedia 45(2013), pp. 149-152.

Yoshida, T. et al. "Fabrication of Eu1Ba2Cu307-5+BaHf03 coated conductors with 141 A/cm-w under 3 T at 77 K using the IBAD/PLD process." Physica C 504(2014), pp. 42-46.

Mukaida, M. et al. "Perovskite Structures in the Formation of Nano-rods in REBa2Cu307-5 Films." Journal of Cryogenics and Superconductivity Society of Japan, vol. 44, No. 1 (2009), pp. 25-31.

Zhang, J. L. et al. "BaZr03 and BaHf03: preparation, properties and compatibility with YBa2Cu307-x." Journal of Materials Science 29(1994), pp. 778-785.

John, J. et al. "Synthesis, Structural and Morphological Property of BaSn03 Nanopowder Prepared by Solid State Ceramic Method." Materials Science and Engineering 195(2017)012007, pp. 1-5.

Li, Z, et al. "Control of nanostructure and pinning properties in solution deposited YBa2Cu307-x nanocomposites with preformed perovskite nanoparticles." https://urldefense.com/v3/_https://www.nature.com/articles/s41598-019-42291-X__;!! BzMsqVLNNjU!fYMdvBxIAMxLOQ2GrAltbSkgN5ZRiOG2gLUKINqwEAls65Q4yrkA-KzojfSVzPwQXBM$, (2019), pp. 1-14.

Shiohara, Y. et al. "Development of REBCO Coated Conductors:—Relationship between Microstructure and Critical Current Characteristics—", J. Japan Inst. Met. Mater., vol. 80, No. 7 (2016)406-19.

Japanese National Phase PCT Laid-Open Publication No. 2016-522534 (corresponding English version cited as WO 2014/209458).

International Search Report and Written Opinion received in PCT Application No. PCT/US2017/049087, mailed Dec. 18, 2017.

Aytug, T., et al., "Enhanced flux pinning in MOCVD-YBCO films through Zr additions: systematic feasibility studies," Superconductor Science and Technology, IOP Publishing, Techno House, Bristol, GB, vol. 23, No. 1,Jan. 1, 2010 (Jan. 1, 2010), XP020167951, ISSN: 0953-2048.

Extended European Search Report received in EP Application No. 17847352.6, mailed Feb. 25, 2020.

Mukaida, M., et al., "Surface resistance of YBa2Cu307-5 thin films on MgO lattice-matched Bazr03 buffer layers," Superconductor Science and Technology, IOP Publishing, Techno House, Bristol, GB, vol. 17, No. 3,Mar. 1, 2004 (Mar. 1, 2004), XP020051732, ISSN: 0953-2048, DOI: 10.1088/0953-2048/17/3/007.

Office Action received in KR Application No. 10-2019-7009022, mailed Mar. 30, 2020.

Galystan, Eduard, et al., Microstructure Characteristics of High Lift Factor MOCVD REBCO Coated Conductors With High Zr Content, IEEE Transactions on Applied Superconductivity, Jun. 3, 2015, 5 pages, vol. 25, No. 3, University of Houston, U.S.

Liu, Y., et al., Electromagnetic Properties of (Gd, Y) Ba2Cu3Ox Superconducting Tapes With High Levels of Zr Addition, IEEE Transactions on Applied Superconductivity, Jun. 3, 2015, 4 pages, vol. 23, No. 3, University of Houston, U.S.

Majkic, Goran, et al., Effect of High BZO Dopant Levels on Performance of 2G-HTS MOCVD Wire at Intermediate and Low Temperatures, IEEE Transactions on Applied Superconductivity, Jun. 3, 2013, 5 pages, vol. 23, No. 3, University of Houston, U.S.

Selvmanickam, V., Correlation between in-field critical currents in Zr-added (Gd, Y)Ba2,Cu3,Ox superconducting tapes at 30 and 77 K, Superconductor Science and Technology, Mar. 11, 2014, pp. 1-7, vol. 27, IP Publishing, United Kingdom.

Office Action issued in co-pending Japanese Application No. 2019-531568, dated Jul. 14, 2020, 8 pages.

Examination Report issued in co-pending Indian Application No. 201917008701, dated Oct. 7, 2020, 8 pages.

Shrivastava, Shailaj K. "Crystal Structures of Cuprate Based Superconducting Materials." International Journal of Engineering, Science and Mathematics, vol. 7 Issue 5, May 2018. ISSN: 2320-0294 Impact Factor:6.765 (http://www.ijesm.co.in) pp. 151-159.

Manthiram, A., et al. "The Influence of Oxygen Variation on the Crystal Structure and Phase Composition of the Superconductor YBa2Cu307-x." J. Am. Chem. Soc. 1987, 109, pp. 6667-6669.

Whangbo, Myung-Hwan, et al. "Simuation of Crystal Structures by Empirical Atom-Atom Potentials." Ingor. Chem. 1988, 27. pp. 467-74.

Park, Y. K. et al. "In Situ Deposition of YBCO Thin Films by Sputtering under Low Oxygen Partial Pressure." Jpn. J. Appl. Phys. Vol. 33 (1994) pp. L718-L721. Part 2, No. 5B May 1994.

Gharahcheshmeh, M. H., et al. "Superconducting Characteristics of REBCO Coated Conductors With Different Zr Content" IEEE Transactions on Applied Superconductivity, vol. 29, No. 5, Aug. 2019. 5 pages.

Gharahcheshmeh, M. H., et al. "Control of in-field performance of 25 mol.% Zr-added REBCO superconductor tapes." Physica C: Superconductivity and its applications 553 (2018) 26-32. www.elsevier.com/locate/physc.

| Sample | (Ba+Zr)/Cu |
|---|---|
| 1 | 0.6519 |
| 17 | 0.7345 |
| 15 | 0.7361 |
| 3 | 0.7382 |
| 4 | 0.7501 |
| 11 | 0.7522 |
| 16 | 0.7546 |
| 13 | 0.7546 |
| 12 | 0.7571 |
| 10 | 0.7623 |

QUALITY CONTROL OF HIGH PERFORMANCE SUPERCONDUCTOR TAPES

CROSS REFERENCE TO RELATED APPLICATION(S)

This application is a continuation of U.S. patent application Ser. No. 17/865,860, filed on Jul. 15, 2022, which is a divisional of U.S. patent application Ser. No. 16/329,658, filed on Feb. 28, 2019, now U.S. Pat. No. 11,393,970, which is a 371 application of PCT/US2017/049087, filed on Aug. 29, 2017, which claims priority to U.S. provisional patent application No. 62/381,369, filed on Aug. 30, 2016. These applications are hereby incorporated herein by reference in their entireties.

GOVERNMENT SPONSORSHIP

Office of Naval Research Award N00014-14-1-0182.

FIELD OF THE DISCLOSURE

The embodiments disclosed herein are in the field of superconductor tapes. More particularly, the embodiments disclosed herein relate to superconductor tapes and methods for manufacturing, measuring, monitoring, and controlling same, which, inter alia, achieve well-aligned nanocolumnar defects and thus a high lift factor, which can result in superior critical current performance of the tape in, for example, high magnetic fields.

BACKGROUND

Several materials systems are being developed to solve the looming problems with energy generation, transmission, conversion, storage, and use. Superconductors are quite likely a unique system that provides a solution across a broad spectrum of energy problems.

Superconductors enable high efficiencies in generators, power transmission cables, motors, transformers and energy storage. Further, superconductors transcend applications beyond energy to medicine, particle physics, communications, and transportation. Superconducting tapes have come of age, enabled by a novel approach to create epitaxial, single-crystal-like thin films on polycrystalline substrates. In this technique, a thin film of materials with rock-salt crystal structure such as MgO is deposited by ion beam-assisted deposition over flexible, polycrystalline substrates.

Superconducting films that are processed by this technique exhibit critical current densities comparable to that achieved in epitaxial films grown on single crystal substrates. Using this technique, several institutions have demonstrated pilot-scale manufacturing of superconducting composite tapes. It is quite remarkable that currently a single crystal-like epitaxial film may be manufactured to over a length of a kilometer using a polycrystalline substrate base.

Figure 1A:
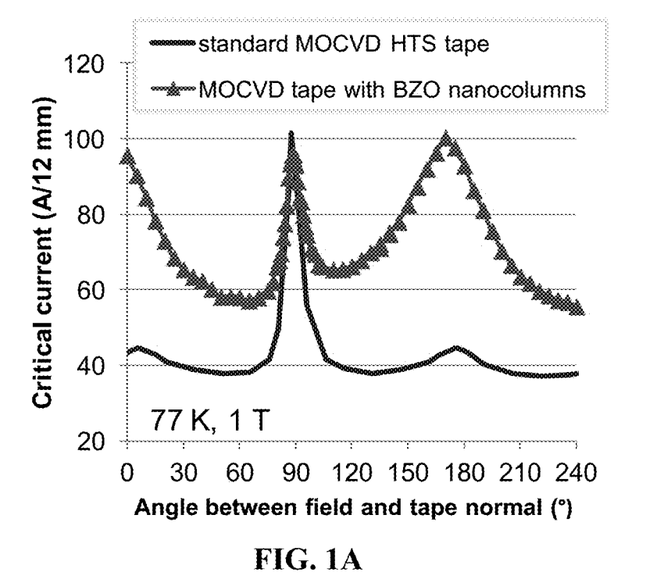
FIG. 1A is a plot illustrating anisotropy in critical current of MOCVD-based HTS tape with and without self-assembled $BaZrO_3$ (BZO) nanocolumns.

However, there are certain drawbacks to today's superconductor tapes. The current carrying capability of superconductors rapidly diminishes in a magnetic field, which poses a problem for their use in applications such as wind generators where the generator coil would be subjected to magnetic fields of a few Tesla. Additionally, since superconductivity in high-temperature superconductors (HTSs) is localized within their Cu—O planes, HTS materials exhibit strong anisotropic behavior. This anisotropy is evident in critical current measurements when a magnetic field is aligned at different angles to the film surface (FIG. 1A). As shown in FIG. 1A, the critical current of a standard HTS tape drops rapidly as the field is moved away from the film surface and reaches a low value when the field is oriented perpendicular to the tape, which is the limiting value in coils constructed with these tapes.

Pinning improvement strategies for practical superconductors have been actively developed over the last decade to improve in-field performance. The most explored approach has been to introduce defects into the superconductor that are comparable in lateral dimensions to superconducting coherence length. In 2G HTS tapes, such defects include oxygen vacancies, threading dislocations, twin planes, impurity atoms, irradiation-induced columnar defects, and nanostructured inclusions of various composition and structure.

Figure 1B:
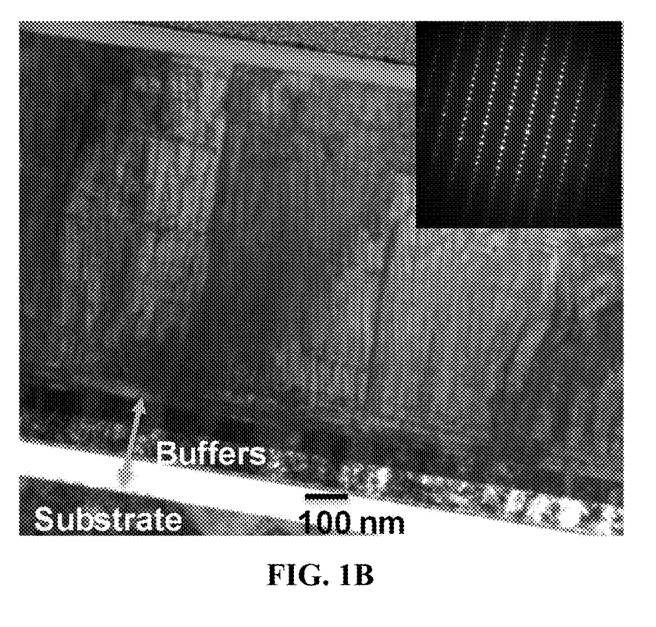
FIG. 1B is a diagram illustrating cross-sectional microstructures of a Zr-doped superconducting film synthesized by MOCVD, showing abundant nanocolumnar defects of self-assembled BZO.

Recently, to improve pinning, researchers developed an approach for columnar defect formation based on chemically doping the superconducting film with $BaMO_3$ (M=Zr, Sn, Hf, Nb, Ce, Ta, etc.). The BZO and $BaSnO_3$ (BSO) inclusions form nano-sized columns, about 5 nm in diameter, by a self-assembly process during superconductor film growth and significantly improve the pinning strength. FIG. 1B displays a cross sectional microstructure of a $(Gd,Y)Ba_2Cu_3O_x$ (Gd—YBCO) superconducting film grown by MOCVD with abundant self-assembled $BaZrO_3$ (BZO) nanocolumnar defects, mostly oriented perpendicular to the film plane. Films with such a microstructure exhibit two-fold improved performance in a magnetic field at 77 K, especially in orientations along the direction of the BZO nanocolumns and result in a lower anisotropy, as shown in FIG. 1A.

Furthermore, research demonstrated that a higher level of Zr addition led to more favorable properties in magnetic fields at low temperatures. In particular, the 'lift factor,' which is the ratio of critical current of the tape in applied magnetic field at low temperature to the critical current of the tape at 77 K in zero magnetic field, was found to be increased in tapes with higher levels of Zr content. It was also recently shown that high critical current density can be achieved in RE-Ba—Cu—O (REBCO, RE=rare earth) tapes with high levels of Zr addition, even at 77 K. This achievement opened the possibility of combining lift factor at low temperatures in magnetic fields with high critical current density at 77 K to reach very high critical currents at the low temperatures in magnetic fields of interest to many applications. However, it has since been discovered that REBCO tapes with high levels of Zr addition do not always lead to high lift factors at lower temperatures in magnetic fields. In essence, for REBCO tapes with high levels of Zr addition, the lift factor at lower temperatures in magnetic fields has been found to be inconsistent. Accordingly, there is need in the art for superconducting tapes that can consistently achieve substantially high critical currents at lower temperatures in magnetic fields.

SUMMARY

Embodiments are directed to a superconductor tape comprising: a substrate; a buffer layer overlying the substrate; and a superconductor film overlying the buffer layer. The superconductor film is defined as having a c-axis lattice constant higher than 11.74 Angstroms.

In an embodiment, the superconductor film (or the tape in general) is over 10 meters in length.

In an embodiment, the superconductor film comprises 5 to 30 mol % of dopant selected from the group consisting of Zr, Sn, Ta, Nb, Hf, Ce, and a combination thereof.

In an embodiment, the superconductor film comprises $BaMO_3$, where M=Zr, Sn, Ta, Nb, Hf, or Ce, and which has a (101) peak of $BaMO_3$ elongated along an axis that is between 60° to 90° from an axis of the (001) peaks of the superconductor film.

Embodiments are also directed to a superconductor tape comprising: a substrate; a buffer layer overlying the substrate; and a superconductor film overlying the buffer layer. The superconductor film comprises $BaMO_3$, where M=Zr, Sn, Ta, Nb, Hf, or Ce, and which has a (101) peak of $BaMO_3$ elongated along an axis that is between 60° to 900 from an axis of the (001) peaks of the superconductor film.

In an embodiment, the (101) peak of $BaMO_3$ is measured by X-ray diffraction.

In an embodiment, the superconductor film (or the tape in general) is over 10 meters in length.

In an embodiment, the superconductor film comprises 5 to 30 mol % of dopant selected from the group consisting of Zr, Sn, Ta, Nb, Hf, Ce, and a combination thereof.

In an embodiment, the superconductor film is defined as having a c-axis lattice constant higher than 11.74 Angstroms.

Embodiments are further directed to a superconductor tape comprising: a substrate; a buffer layer overlying the substrate; and a superconductor film overlying the buffer layer. The superconductor film comprises $BaMO_3$, where M=Zr, Sn, Ta, Nb, Hf, or Ce, and which has a (101) peak of $BaMO_3$ located at a 2theta angle higher than 300 when measured by X-ray Diffraction using copper k alpha radiation.

In an embodiment, the superconductor film comprises 5 to 30 mol % of dopant selected from the group consisting of Zr, Sn, Ta, Nb, Hf, Ce, and a combination thereof.

In an embodiment, the superconductor film is defined as having a c-axis lattice constant higher than 11.74 Angstroms.

Embodiments are yet further directed to a superconductor tape comprising: a substrate; a buffer layer overlying the substrate; and a superconductor film overlying the buffer layer. The superconductor film comprises $BaMO_3$, where M=Zr, Sn, Ta, Nb, Hf, or Ce, and which has a (101) peak of $BaMO_3$ located at a 2theta angle less than 2.6° from the (103) peak of the superconductor phase when measured by X-ray Diffraction using copper k alpha radiation.

In an embodiment, the superconductor film comprises 5 to 30 mol % of dopant selected from the group consisting of Zr, Sn, Ta, Nb, Hf, Ce, and a combination thereof.

In an embodiment, the superconductor film is defined as having a c-axis lattice constant higher than 11.74 Angstroms.

Embodiments are yet further directed to a method of measuring a c-axis lattice parameter of a superconductor film in a superconductor tape. The method comprises providing a superconductor tape comprising: a substrate; a buffer layer overlying the substrate; and a superconductor film deposited over the buffer layer. The method also comprises measuring the c-axis lattice parameter of the superconductor film via in-line X-ray Diffraction in real-time during deposition of the superconductor film over the buffer layer.

In an embodiment, the step of measuring is performed subsequent deposition of the superconductor film.

In an embodiment, the superconductor film (or the tape in general) is over 10 meters in length.

In an embodiment, the superconductor film comprises 5 to 30 mol % of dopant selected from the group consisting of Zr, Sn, Ta, Nb, Hf, Ce, and a combination thereof.

In an embodiment, the c-axis lattice parameter is a c-axis lattice constant higher than 11.74 Angstroms.

In an embodiment, the superconductor film comprises $BaMO_3$, where M=Zr, Sn, Ta, Nb, Hf, or Ce, and which has a (101) peak of $BaMO_3$ elongated along an axis that is between 60° to 90° from an axis of the (001) peaks of the superconductor film.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

DETAILED DESCRIPTION

Heavy-doping of REBCO films is necessary, but not a sufficient enough condition to achieve high lift factor in critical current (Ic) at low temperatures. The inventors have discovered that a strong alignment of BaMO$_3$ (M=Zr, Sn, Hf, Nb, Ce, Ta, etc.) nanocolumns along the c-axis of the REBCO films is an important condition to achieving high lift factors.

Figure 2A:
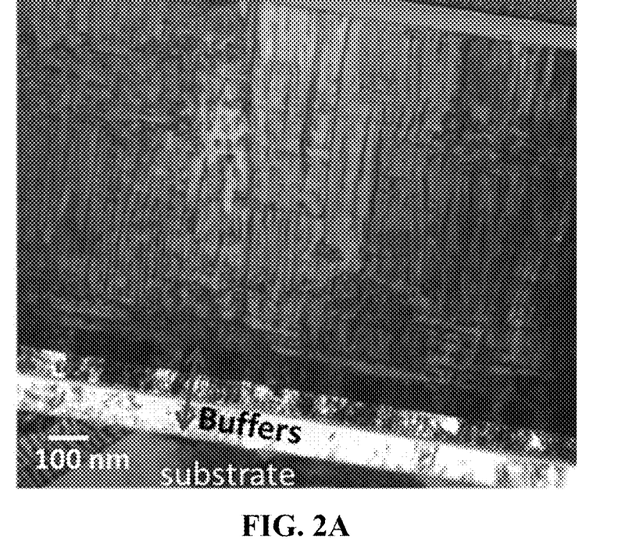
FIG. 2A is a diagram illustrating a cross-sectional TEM analysis of a Zr-added (Gd,Y)BCO tape with a low lift factor in Ik at 30 K, 2.5 T, showing not well-aligned, discontinuous BZO nanocolumns perpendicular to the tape plane.
Figure 2B:
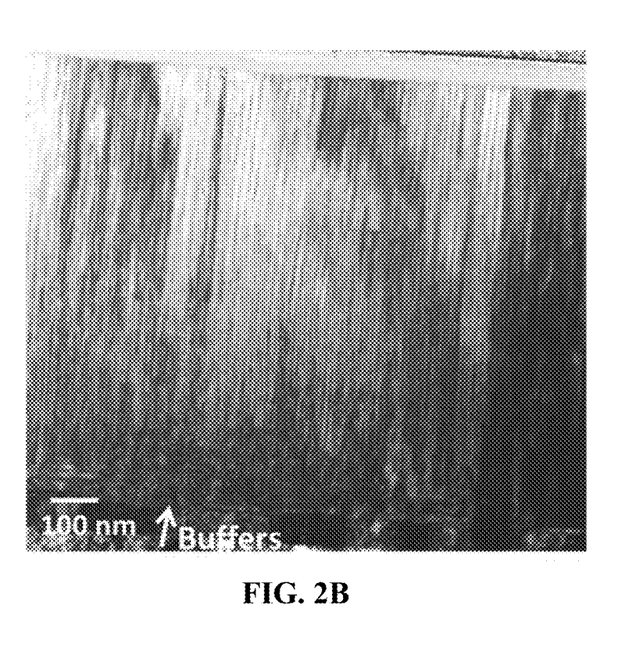
FIG. 2B is a diagram illustrating a cross-sectional TEM analysis of a Zr-added (Gd,Y)BCO tape with a high lift factor in Ic at 30 K, 2.5 T, exhibiting strongly-aligned, continuous BZO nanocolumns.

For example, FIGS. 2A and 2B show cross-sectional microstructures of two tapes with the same $J_c$ of 3.08 MA/cm$^2$ at 77 K, 0 T, but with different lift factors in critical currents of 3.85 and 6.93 at 30 K, 2.5 T (B∥c). The tape in FIG. 2A has a low lift factor, and it consists of BZO nanocolumns that are not well-aligned and not continuous from the buffer layers to the film surface. On the other hand, the tape in FIG. 2B has a high lift factor and consists of strongly-aligned BZO nanocolumns continuous from the buffer layers to the film surface. The inventors have discovered that the microstructural difference shown in FIG. 2A-2B is the culprit behind the large scatter in the critical current of doped GdYBCO tapes at 30 K, 3 T. Accordingly, along with the Zr-doping, a strong alignment of BZO nanocolumns along the c-axis of the REBCO films is critical to achieve consistently high lift factors. While the embodiments described herein primarily reference BZO films, it is understood that the embodiments equally apply to any BaMO$_3$ (M=Zr, Sn, Hf, Nb, Ce, Ta, etc.) films.

However, microstructural examination of the alignment of such nanocolumns in REBCO tapes is a destructive technique and is relegated to very small areas of a few square micrometers. It is therefore desirable to provide a nondestructive method that can be used to examine larger areas of REBCO tapes to verify if the highly-aligned nanocolumnar defects are present. Additionally, there is great value if such method can be implemented in-line in the processing of REBCO tapes so that the feedback from the microstructural analysis can be used in real-time for monitoring and, in turn, control of the process to achieve well-aligned nanocolumnar defects and hence superior critical current performance in high magnetic fields. By detecting/measuring the BaMO$_3$ (M=Zr, Sn, Hf, Nb, Ce, Ta, etc.) nanocolumn alignment in real-time during superconductor manufacture, the manufacturing process can be modified to consistently obtain the required degree of alignment. Examples of modification to the manufacturing process are lowering the deposition temperature and/or increasing the oxygen partial pressure and/or increasing the barium content in the precursor and/or decreasing the copper content in the precursor. These and other advantages of the present invention will become more fully apparent from the detailed description of the invention herein below.

It is to be understood that the figures and descriptions of the present invention may have been simplified to illustrate elements that are relevant for a clear understanding of the present embodiments, while eliminating, for purposes of clarity, other elements found in a typical superconductor tape or typical method for fabricating, measuring, monitoring, or controlling a superconductor tape. Those of ordinary skill in the art will recognize that other elements may be desirable and/or required in order to implement the present embodiments. However, because such elements are well known in the art, and because they do not facilitate a better understanding of the present embodiments, a discussion of such elements is not provided herein. It is also to be understood that the drawings included herewith only provide diagrammatic representations of the presently preferred structures of the present invention and that structures falling within the scope of the present embodiments may include structures different than those shown in the drawings. Reference will now be made to the drawings wherein like structures are provided with like reference designations.

Before explaining at least one embodiment in detail, it should be understood that the concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other embodiments of devices, systems, methods, features, and advantages described herein will be or become apparent to one with skill in the art upon examining the drawings and the detailed description herein. It's intended that all such additional devices, systems, methods, features, and advantages be protected by the accompanying claims.

For purposes of this disclosure, the terms "film" and "layer" may be used interchangeably.

Embodiments of the present application are directed to a non-destructive method to rapidly qualify the (Ba+Zr)/Cu content of REBCO tapes, which may optionally be implemented even in real-time during processing of the tapes as a quality control tool. Additionally, embodiments of the present application provide a non-destructive method to qualify the orientation of the nanocolumnar defects of BaMO$_3$, which determines the magnitude of the lift factor in critical current performance. Therefore, at least one objective of embodiments of the present application is to consistently achieve a uniformly high critical current in a magnetic field in long lengths of REBCO tapes. Another objective is to develop a quality control (QC) tool to monitor the quality of the REBCO tape in situ during tape fabrication (or after fabrication) so as to enable uniformly high critical current in a magnetic field. Moreover, a key aspect of embodiments of the present application is the development of a non-destructive, rapid, in-line quality control method that can be used to determine the quality of the alignment of nanocolumnar defects and, in turn, predict the performance of REBCO tapes in high magnetic fields.

In an embodiment, a nondestructive method based on X-ray Diffraction (XRD) of superconductor tapes is capable of determining the critical compositional ratio of Ba, Cu, and dopant on which the critical current of the tape in a magnetic field depends on. In another embodiment, an XRD method is disclosed that can nondestructively determine the degree of orientation of nanocolumnar defects in the superconductor film of superconductor tape. In yet another embodiment, an X-ray Diffraction unit in an in-line mode in a superconductor deposition apparatus can obtain real-time information on the compositional ratio of Ba, Cu, and dopant.

Figure 3A:
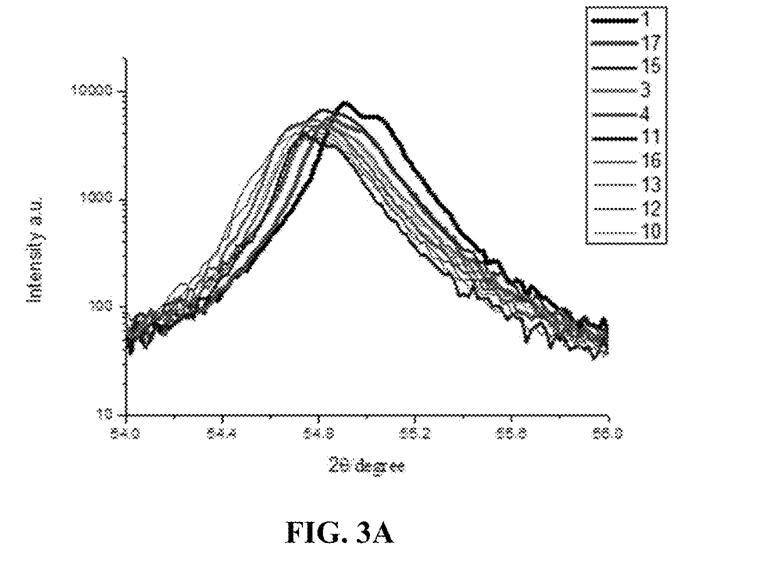
FIG. 3A is a plot illustrating (007) peaks of the REBCO phase of several Zr-doped (Gd,Y)BCO tapes with increasing levels of (Ba+Zr)/Cu content, as measured by X-ray Diffraction using copper K-alpha (Cu K-α) radiation.
Figure 3B:
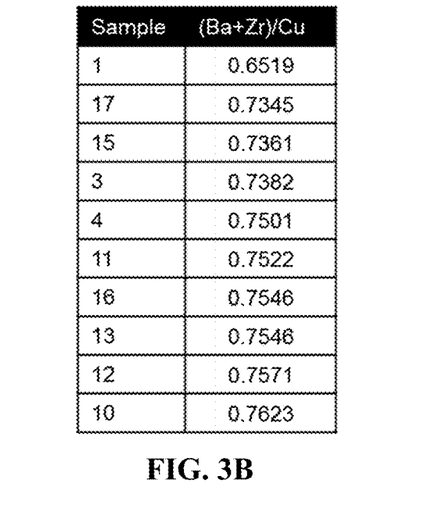
FIG. 3B is a table illustrating the (Ba+Zr)/Cu composition of the REBCO tapes referenced in the plot of FIG. 3A.
Figure 4:
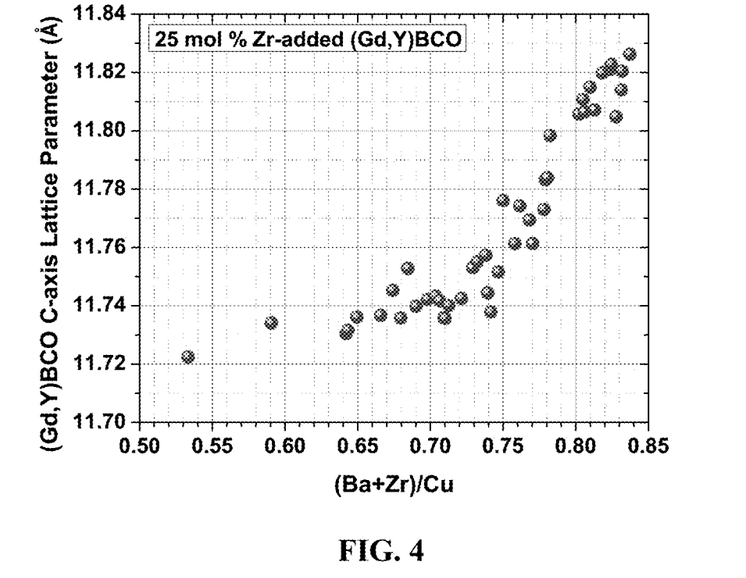
FIG. 4 is a plot illustrating a c-axis lattice parameter of several Zr-doped (Gd,Y)BCO tapes with increasing levels of (Ba+Zr)/Cu content, as measured by X-ray Diffraction.

FIG. 3A, by way of example only, is a plot illustrating (007) peaks of the REBCO phase of several Zr-doped (Gd,Y)BCO tapes with increasing levels of (Ba+Zr)/Cu content, as measured by XRD using Cu K-α radiation. In other words, FIG. 3A shows the (007) peak from XRD analysis of Zr-added REBCO tapes with different compositions of Ba, Cu, and Zr. FIG. 3B, by way of example only, is a table illustrating the (Ba+Zr)/Cu composition of the REBCO tapes referenced in the plot of FIG. 3A. As shown in FIGS. 3A-3B, as the (Ba+Zr)/Cu content increases, the (007) peak location shifts to 2theta values, i.e., the c-axis lattice parameter increases. FIG. 4, by way of example only, is a plot illustrating a c-axis lattice parameter of several Zr-doped (Gd,Y)BCO tapes with increasing levels of (Ba+Zr)/Cu content, as measured by XRD. The aforementioned trend of increasing c-axis lattice parameter with increasing content of (Ba+Zr)/Cu in the REBCO tape is clearly shown in FIG. 4.

Figure 5:
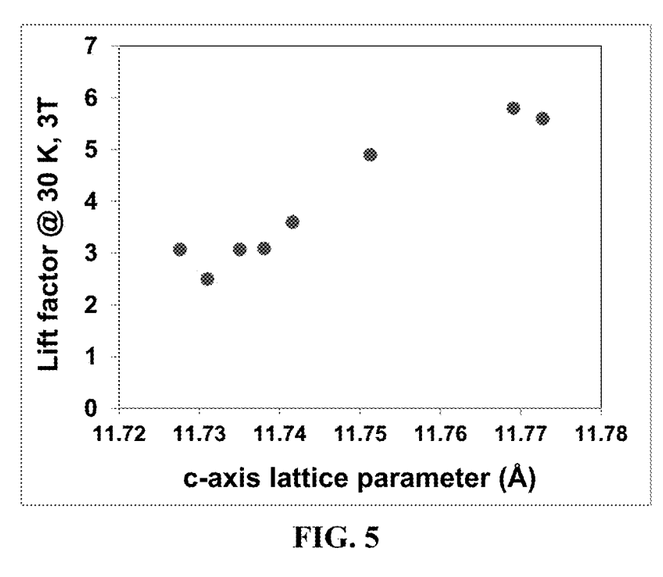
FIG. 5 is a plot illustrating dependence of the lift factor in critical current at 30 K of several Zr-doped (Gd,Y)BCO tapes with increasing values of c-axis lattice parameter, as measured by X-ray Diffraction.

Specifically, as the (Ba+Zr)/Cu content in the REBCO tape is increased from 0.53 to 0.84, the c-axis lattice parameter increases from 11.72 Å to 11.84 Å. The c-axis lattice parameter increases sharply beyond 11.74 Å. FIG. 5, by way of example only, is a plot illustrating the dependence of the lift factor in critical current of several Zr-doped (Gd,Y)BCO tapes with increasing values of c-axis lattice parameter, as measured by XRD. As shown in FIG. 5, as the c-axis lattice parameter of the REBCO tape increases, the lift factor in critical current at 30 K, 3 T (magnetic field B∥c-axis) also increases. Hence, the measurement of the c-axis lattice parameter or the shift in the 2theta value of a (001) peak of REBCO by XRD is a very good indicator of the in-field critical current performance of the tape.

While a higher value of (Ba+Zr)/Cu and a higher c-axis lattice parameter is desirable, it does not assure achieving good in-field performance in REBCO tapes. As shown in FIG. 2B, it is also essential that the BZO nanocolumns are well-aligned through the thickness of the REBCO film. Since there is a tendency of the BZO nanocolumns to orient along the a-b plane in heavily-doped films, it is more challenging to assure the uninhibited growth of c-axis-aligned nanocolumns. Minor fluctuations in the temperature, oxygen partial pressure and incorporation of barium and copper in the films can perturb the growth of well-aligned nanocolumns.

Additionally, it is important to achieve a well-aligned nanocolumn growth without excessive (Ba+Zr)/Cu and too high a c-axis lattice parameter of REBCO since the critical current at 77 K in zero magnetic field may be reduced. To achieve a high critical current at lower temperatures in high magnetic fields, it important to achieve a high lift factor as well as good critical current at 77 K in zero magnetic field.

Figure 6:
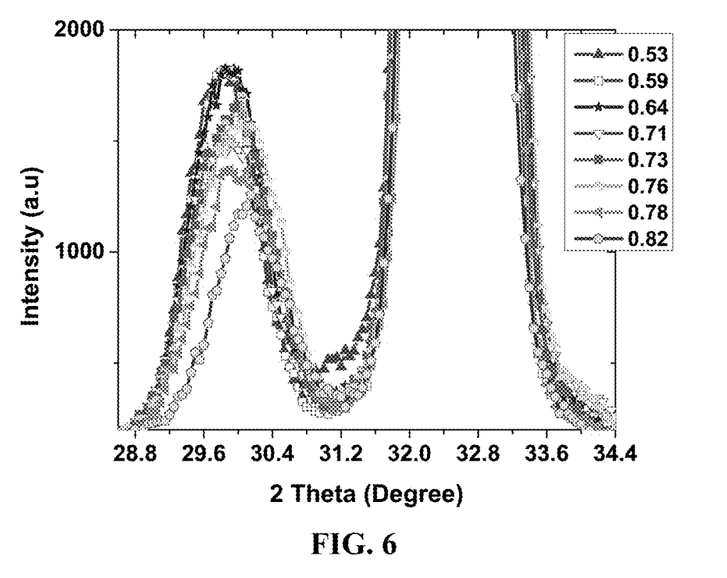
FIG. 6 is a plot illustrating (101) peaks of BZO of several Zr-doped (Gd,Y)BCO tapes with increasing levels of (Ba+Zr)/Cu content, as measured by X-ray Diffraction using Cu K-α radiation.

FIG. 6, by way of example only, is a plot illustrating the (101) peaks of the BZO phase of several Zr-doped (Gd,Y)BCO tapes with increasing levels of (Ba+Zr)/Cu content, as measured by XRD using Cu K-α radiation. As shown in FIG. 6, as the (Ba+Zr)/Cu content increases, the (101) peak location of the BZO phase shifts to higher 2theta values, i.e., its lattice parameter increases. The (101) peak location of the BZO phase shifts to values higher than 300 for (Ba+Zr)/Cu content greater than 0.71.

Figure 7:
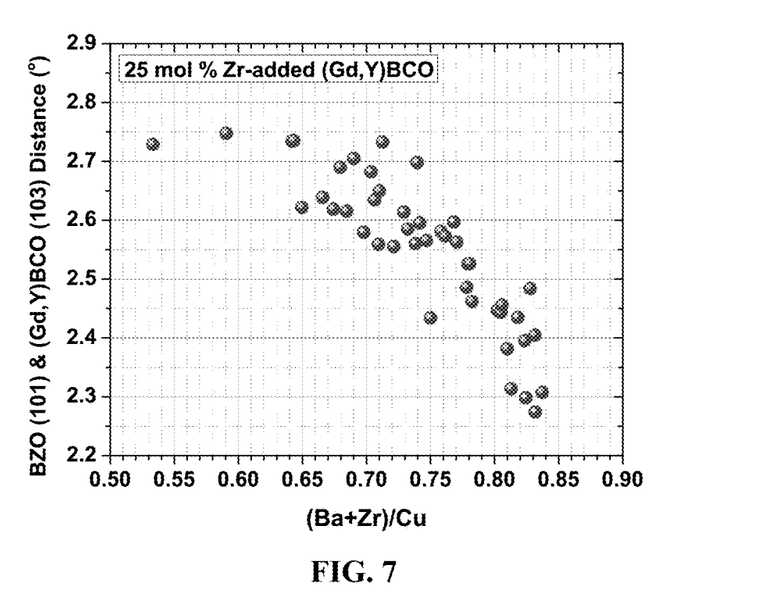
FIG. 7 is a plot illustrating the angular distance between the peak locations of the BZO (101) peak and (103) peak of the REBCO phase of several Zr-doped (Gd,Y)BCO tapes with increasing levels of (Ba+Zr)/Cu content, as measured by X-ray Diffraction using Cu K-α radiation.

FIG. 7, by way of example only, is a plot illustrating the angular distance between the peak locations of the BZO (101) peak and (103) peak of the REBCO phase of several Zr-doped (Gd,Y)BCO tapes with increasing levels of (Ba+Zr)/Cu content, as measured by XRD using Cu K-α radiation. As shown in FIG. 7, as the (Ba+Zr)/Cu content increases beyond 0.72, the distance between the peak locations of the BZO (101) peak and (103) peak of the REBCO phase decreases below 2.6°. In other words, as the (Ba+Zr)/Cu content increases beyond a certain threshold, the lattice parameters of BZO and REBCO phase become closer together.

Figure 8:
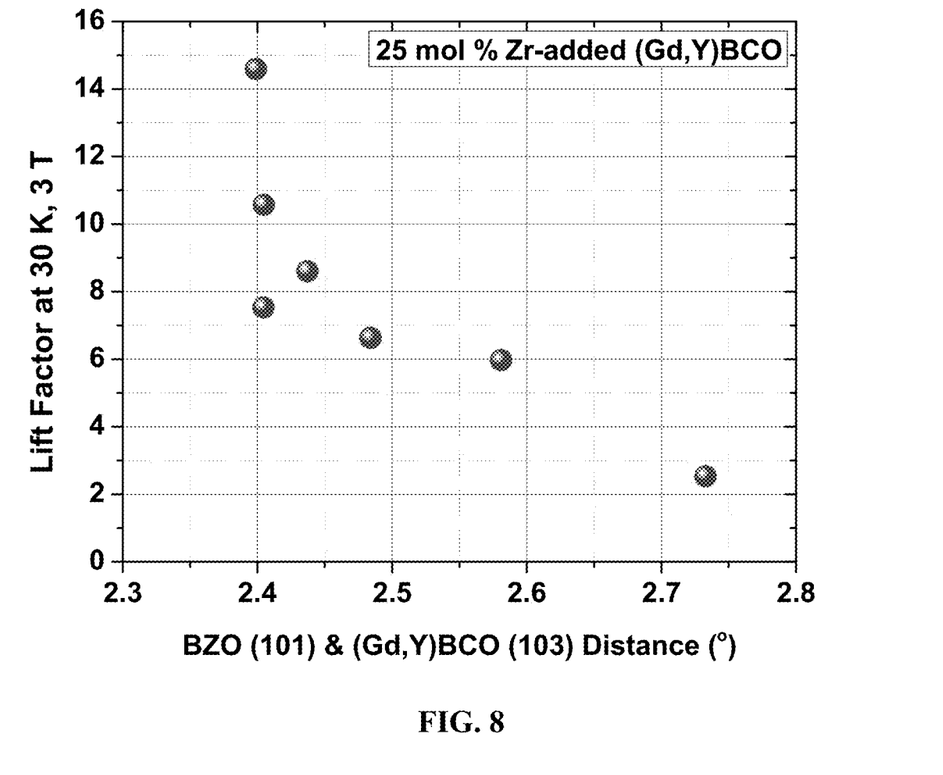
FIG. 8 is a plot illustrating the lift factor in critical current at 30 K, 3 T with changing angular distance between the peak locations of the BZO (101) peak and (103) peak of the REBCO phase of several Zr-doped (Gd,Y)BCO tapes with increasing levels of (Ba+Zr)/Cu content, as measured by X-ray Diffraction using Cu K-α radiation.

FIG. 8, by way of example only, is a plot illustrating the lift factor in critical current at 30 K, 3 T with changing angular distance between the peak locations of the BZO (101) peak and (103) peak of the REBCO phase of several Zr-doped (Gd,Y)BCO tapes with increasing levels of (Ba+Zr)/Cu content, as measured by XRD using Cu K-α radiation. As shown in FIG. 8, as the angular distance between the peak locations of the BZO (101) peak and (103) peak of the REBCO phase decreases below 2.6°, the lift factor in critical current at 30 K, 3 T increases to values of 6 and higher. As the lattice parameters of BZO and REBCO phase become closer together, the BZO nanocolumns become better aligned leading to higher lift factors in critical current.

Figure 9A:
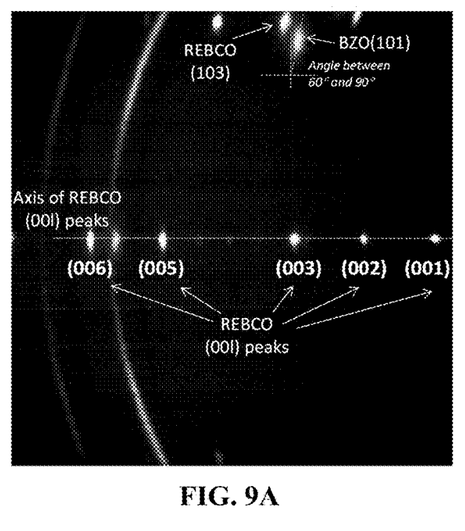
FIG. 9A is a plot illustrating two-dimensional (2D) X-ray Diffraction (XRD) data from Zr-added (Gd,Y)BCO tapes with strongly-aligned, long BZO nanocolumns exhibiting a high lift factor in critical current at 30 K, 3 T.
Figure 9B:
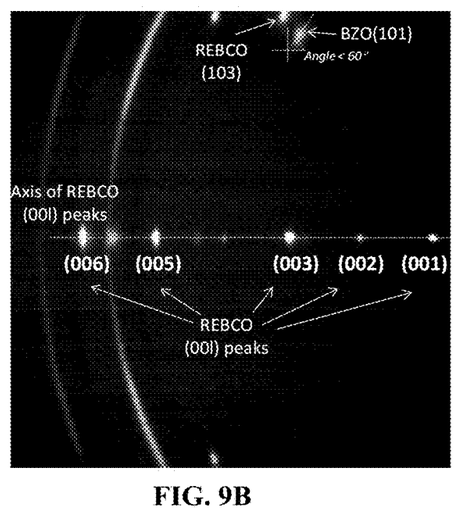
FIG. 9B is a plot illustrating two-dimensional (2D) XRD data from Zr-added (Gd,Y)BCO tapes with not well-aligned, short BZO nanocolumns exhibiting a low lift factor in critical current at 30 K, 3 T.

FIG. 9A, by way of example only, is a plot illustrating 2D XRD data from Zr-added (Gd,Y)BCO tapes with strongly-aligned, long BZO nanocolumns exhibiting a high lift factor in critical current at 30 K, 3 T. As shown in FIG. 9A, the BZO (101) peak in the REBCO film with strongly c-axis-aligned BZO nanocolumns is found to streak or elongate in a direction nearly perpendicular to the (001) peaks of the REBCO phase. In general, the elongation of the BZO (101) peak is along a direction that is between 600 and 90° from the axis of the (001) REBCO peaks. The REBCO (103) peak itself is shifted towards smaller 2theta values and therefore closer to the BZO (101) peak. These two features are not seen in the Zr-added (Gd,Y)BCO tapes with not well-aligned BZO nancolumns exhibiting a low lift factor in critical current at 30 K, 3 T, as illustrated in FIG. 9B. The BZO (101) peak is elongated along a constant 2theta arc, which is aligned at an angle less than 600 from the axis of the (001) REBCO peaks.

Figure 10:
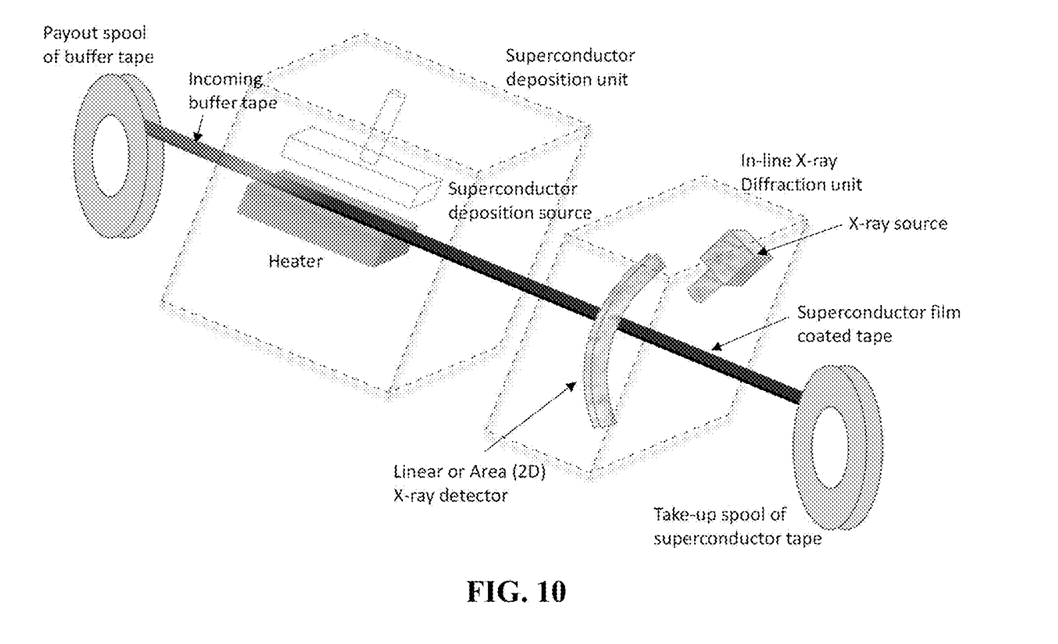
FIG. 10 is a perspective view of a schematic diagram illustrating an in-line X-ray diffraction unit to measure the c-axis lattice parameter as a superconductor tape is being fabricated.

FIG. 10, by way of example only, is a perspective view of a schematic diagram illustrating an in-line X-ray diffraction (XRD) unit/tool that can measure the c-axis lattice parameter as a superconductor tape is being fabricated. With reference to FIG. 10, in one embodiment, an XRD unit is placed in-line with a superconductor deposition unit so as to measure, in real-time, any shift in the c-axis lattice parameter of the REBCO phase in the superconductor tape as it is being produced. If the c-axis lattice parameter of the superconductor film is monitored during its deposition, any deviation from the desired threshold value can be determined and the process can be re-tuned. The XRD unit consists of an X-ray source using a chromium anode as well as a line (linear) or area (2D) X-ray detector that can instantaneously measure the diffracted X-ray peaks over a 20 range of 39-135 degrees. The X-ray source and detector are positioned so as to detect the (007) peak of REBCO. As the tape exits the superconductor deposition unit, it enters the XRD unit. The exact 2θ position of the (007) peak is obtained at different locations along the length of the tape. By monitoring the magnitude of the deviation of the (007) peak from the normal location, the shift in the c-axis lattice parameter can be determined. By continuously monitoring the shift in the (007) REBCO peak location, the shift in the REBCO c-axis lattice parameter and hence the (Ba+Zr)/Cu composition of the film can be determined over the tape length. This real-time data of the REBCO film composition can then be used to adjust the process parameters. For example, the tape temperature, oxygen partial pressure and/or supply of barium and copper precursors can be adjusted in real-time so as to achieve consistent composition of (Ba+Zr)/Cu, and, consequently, consistent critical current performance. These process parameters can be adjusted to maintain the (Ba+Zr)/Cu composition is the optimum interval so as to obtain a high lift factor in critical current as well as good critical current at 77 K in zero applied magnetic field. In another embodiment, the XRD unit can monitor shift in other (001) peaks of REBCO for the same purposes.

Figure 11:
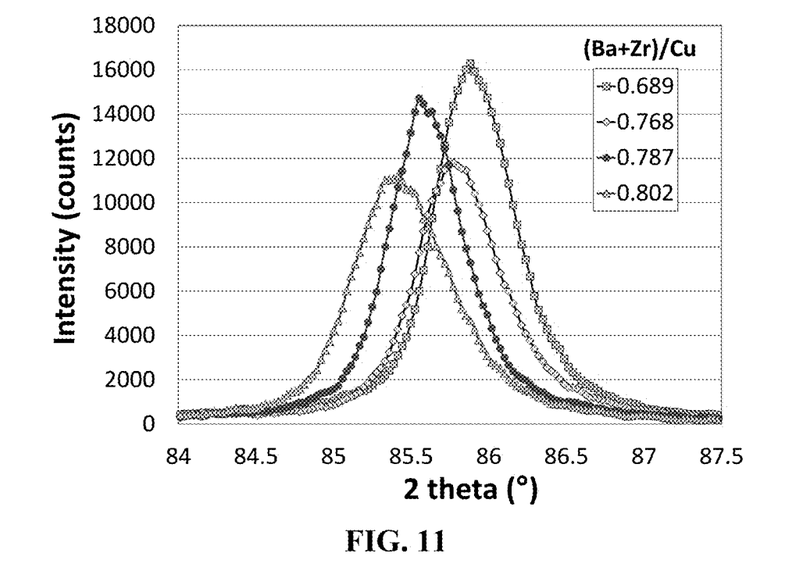
FIG. 11 is a plot illustrating shift of a (007) peak of REBCO tapes with different (Ba+Zr)/Cu content from theta-2theta scans using the in-line XRD tool using Cu K-α radiation.

FIG. 11, by way of example only, is a plot illustrating shift of a (007) peak of REBCO tapes with different (Ba+Zr)/Cu content from theta-2theta scans using the in-line XRD unit/tool shown in FIG. 10. The disclosed in-line XRD tool can discern shifts in the (007) peaks of REBCO films with significantly different (Ba+Zr)/Cu content. As shown in FIG. 11, the 2θ location of the (007) peak of the film shifts towards lower values of 2θ (larger lattice parameter) in films with higher levels of (Ba+Zr)/Cu content. In one embodiment, the 2θ angular resolution of the in-line XRD tool can be improved by modifying the linear detector-to-tape distance and the X-ray optics, such as the number of sensors per units length of the linear detector, as needed, so that subtle changes in (001) peak position can be detected for slight changes in (Ba+Zr)/Cu composition in the REBCO films.

In another embodiment, the X-ray source and linear detector shown in FIG. 10 can be positioned such that the location of the BMO (101) peak of the superconductor tape is monitored as it is produced in the superconductor deposition unit. The exact 2θ position of the BMO (101) peak is obtained at different locations along the length of the tape. By monitoring the magnitude of the deviation of the BMO (101) peak from the normal location, the shift in the c-axis lattice parameter can be determined. By continuously monitoring the shift in the BMO (101) peak location, the (Ba+Zr)/Cu composition of the film can be determined over the tape length, as per the data shown in FIG. 6. This real-time data of the REBCO film composition may then be used to adjust the process parameters, such as tape temperature, oxygen partial pressure and/or supply of barium and copper precursors in real-time so as to achieve consistent composition and, consequently, consistent critical current performance.

In yet another embodiment, the X-ray source and linear detector shown in FIG. 10 can be positioned such that the locations of the BMO (101) peak and the REBCO (103) peak of the superconductor tape are monitored as the tape is produced in the superconductor deposition unit. The exact 2θ positions of the BMO (101) peak and the REBCO (103) peak can be obtained at different locations along the length of the tape. By continuously monitoring the magnitude of the difference in the 2θ positions of the BMO (101) peak and the REBCO (103) peak, the (Ba+Zr)/Cu composition of the film can be determined over the tape length, as per the data shown in FIG. 7. This real-time data of the REBCO film composition can then be used to adjust the process parameters such as tape temperature, oxygen partial pressure and/or supply of barium and copper precursors in real-time so as to achieve consistent composition and, consequently, consistent critical current performance.

In yet another embodiment, the linear detector shown in FIG. 10 is replaced with an area two-dimensional (2D) detector. In this case, the BMO (101) peak may tilt away from its 2θ arc and towards the REBCO (103) peak, as illustrated in FIG. 9A, continuously as the superconductor tape is produced in the superconductor deposition unit. The angle of the tilt of the BMO (101) peak from the axis of the REBCO (001) peaks, as illustrated in FIG. 9A, may also be measured continuously. The manufacturing process parameters, such as tape temperature, oxygen partial pressure and/or supply of barium and copper precursors, may then be adjusted in real-time so as to achieve atilt of the BMO (101) peak within an angle between 60° and 900 from the axis of the REBCO (001) peaks. By this method, a consistent growth of well-aligned BMO nanocolumns may be achieved and, consequently, a consistent critical current performance may also be achieved.

Figure 12:
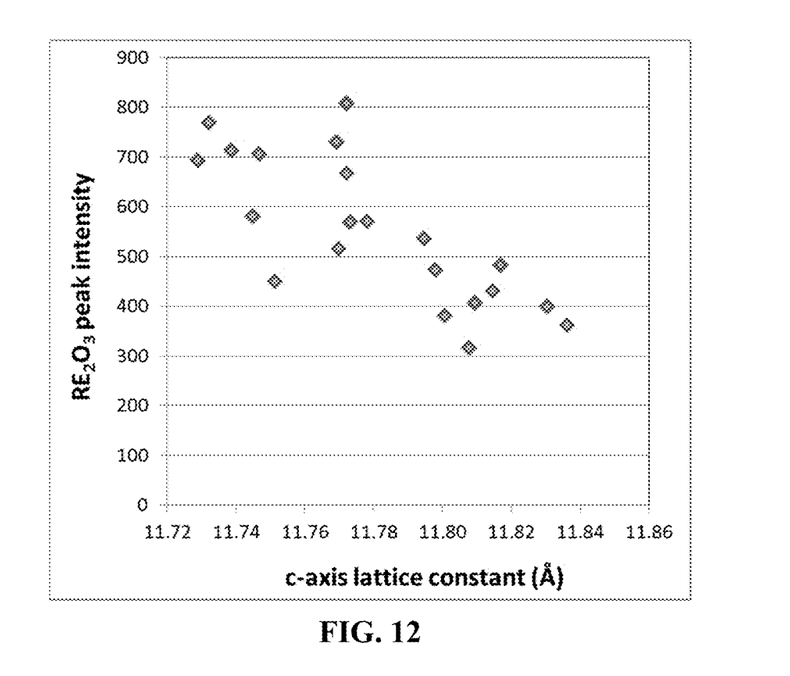
FIG. 12 is a plot illustrating correlation between the c-axis lattice constants of REBCO films with different (Ba+Zr)/Cu content and the intensity of RE2O3 peaks of the films, as measured by X-ray Diffraction using Cu K-α radiation.

FIG. 12, by way of example only, is a plot illustrating the correlation between the c-axis lattice constants of REBCO films with different (Ba+Zr)/Cu content, and the intensity of the RE2O3 peaks of the films, as measured by XRD. In addition to monitoring the 2theta peak location of the (001) peak, the in-line XRD tool can also be utilized to monitor the peak intensity of the RE2O3 peaks along the length of the tape. FIG. 12 shows the correlation between the RE2O3 peak intensity of tapes with different c-axis lattice constants of the REBCO film. REBCO films with higher c-axis lattice constants show reduced RE2O3 peak intensity. Hence, by monitoring the RE2O3 peak intensity with in-line XRD in the processing of REBCO tapes, one can determine changes in the (Ba+Zr)/Cu content in the tapes.

Figure 14:
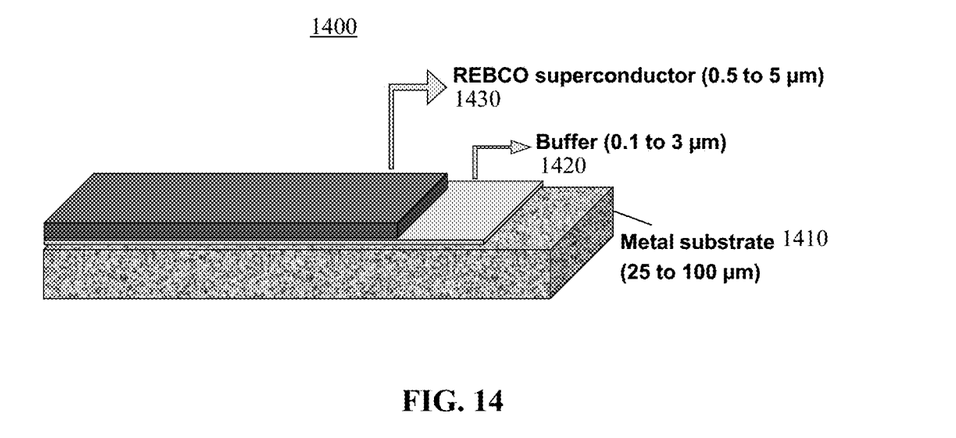
FIG. 14 is a perspective schematic and cross-sectional diagram illustrating a microstructure of an ultra-thin film high-temperature superconducting tape, in accordance with an embodiment.

FIG. 14, by way of example only, is a perspective schematic and cross-sectional diagram illustrating a microstructure of an ultra-thin film high-temperature superconductor tape, in accordance with an embodiment. The superconductor tape 1400 comprises: a substrate 1410; a buffer layer 1420 overlying the substrate 1410; and a superconductor film 1430 overlying the buffer layer 1420. In one embodiment, the superconductor film of FIG. 14 is defined as having a c-axis lattice constant higher than approximately 11.74 Angstroms. In one embodiment, the superconductor film (or the tape in general) is over 10 meters in length. In another embodiment, the superconductor film comprises 5 to 30 mol % of dopant selected from the group consisting of Zr, Sn, Ta, Nb, Hf, Ce, or a combination thereof. In still another embodiment, the superconductor film comprises $BaMO_3$, where M=Zr, Sn, Ta, Nb, Hf, or Ce, and which has a (101) peak of $BaMO_3$ elongated along an axis that is between 60° to 90° from an axis of the (001) peaks of the REBCO superconductor film.

In another embodiment, the superconductor film 1430 of FIG. 14 may comprise $BaMO_3$, where M=Zr, Sn, Ta, Nb, Hf, or Ce, and which has a (101) peak of $BaMO_3$ elongated along an axis that is between 60° to 90° from an axis of the (001) peaks of the REBCO superconductor film. In one embodiment, the (101) peak of $BaMO_3$ is measured by XRD. In another embodiment, the superconductor film (or the tape in general) is over 10 meters in length. In yet another embodiment, the superconductor film comprises 5 to 30 mol % of dopant selected from the group consisting of Zr, Sn, Ta, Nb, Hf, Ce, and a combination thereof. In still another embodiment, the superconductor film is defined as having a c-axis lattice constant higher than 11.74 Angstroms.

In yet another embodiment, the superconductor film 1430 of FIG. 14 may comprise $BaMO_3$, where M=Zr, Sn, Ta, Nb, Hf, or Ce, and which has a (101) peak of $BaMO_3$ located at a 2theta angle higher than 300 when measured by X-ray Diffraction using copper k-alpha radiation. In an embodiment, the superconductor film comprises 5 to 30 mol % of dopant selected from the group consisting of Zr, Sn, Ta, Nb, Hf, Ce, and a combination thereof. In another embodiment, the superconductor film is defined as having a c-axis lattice constant higher than 11.74 Angstroms.

In still another embodiment, the superconductor film 1430 of FIG. 14 may comprise $BaMO_3$, where M=Zr, Sn, Ta, Nb, Hf, or Ce, and which has a (101) peak of $BaMO_3$ located at a 2theta angle less than 2.6° from the (103) peak of the superconductor phase when measured by XRD using copper k-alpha radiation. In an embodiment, the superconductor film comprises 5 to 30 mol % of dopant selected from the group consisting of Zr, Sn, Ta, Nb, Hf, Ce, and a combination thereof. In another embodiment, the superconductor film is defined as having a c-axis lattice constant higher than 11.74 Angstroms.

Figure 13:
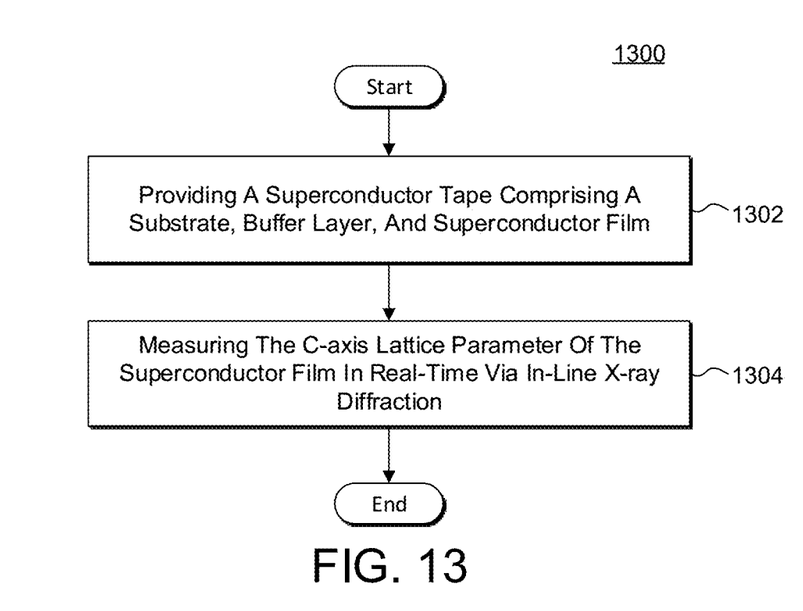
FIG. 13 is a flowchart illustrating an embodiment of a method of measuring a c-axis lattice parameter of a superconductor film in a superconductor tape, in accordance with an embodiment.

By way of example only, FIG. 13 is a flowchart of a method 1300 of measuring a c-axis lattice parameter of a superconductor film in a superconductor tape. In an embodiment, a superconductor tape comprising a substrate, buffer layer, and superconductor film may be provided (block 1302). The buffer layer overlies the substrate, and the superconductor film is deposited over the buffer layer. A c-axis lattice parameter of the superconductor film is measured in real-time via in-line X-ray Diffraction (block 1304) during deposition of the superconductor film over the buffer layer. In one embodiment, the measuring step 1304 is performed subsequent to deposition of the superconductor film. In an embodiment, the superconductor film (or the tape in general) is over 10 meters in length. In yet another embodiment, the superconductor film comprises 5 to 30 mol % of dopant selected from the group consisting of Zr, Sn, Ta, Nb, Hf, Ce, and a combination thereof. In another embodiment, the c-axis lattice parameter is a c-axis lattice constant higher than 11.74 Angstroms. In an embodiment, the superconductor film comprises $BaMO_3$, where M=Zr, Sn, Ta, Nb, Hf, or Ce, and which has a (101) peak of $BaMO_3$ elongated along an axis that is between 60° to 90° from an axis of the (001) peaks of the REBCO superconductor film, or which has a (101) peak of $BaMO_3$ located at a 2theta angle less than 2.6° from the (103) peak of the superconductor phase when measured by XRD using copper k-alpha radiation.

It is understood that the superconducting film discussed in connection with FIG. 14 and FIG. 13 can include one or more of the features discussed above in connection with those figures. Features in any of the embodiments described above may be employed in combination with features in other embodiments described above, and such combinations are considered to be within the spirit and scope of the present invention. Moreover, although the embodiments in method 1300 and the structure of the superconductor tapes are described above with reference to various layers, additional layers may alternatively be implemented in the method 1300 as well as the structure of the superconductor tapes described in any of the embodiments above. Furthermore, the method steps in any of the embodiments described herein are not restricted to being performed in any particular order. Such alternatives are considered to be within the spirit and scope of the present invention, and may therefore utilize the advantages of the configurations and embodiments described above. The contemplated modifications and variations specifically mentioned above are considered to be within the spirit and scope of the present invention.

It's understood that the above description is intended to be illustrative, and not restrictive. The material has been presented to enable any person skilled in the art to make and use the concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description.

The scope of the embodiments herein therefore should be determined with reference to the appended claims, along with the full scope of equivalents to which such claims are entitled. In the appended claims, the terms "including" and "in which" are used as the plain-English equivalents of the respective terms "comprising" and "wherein."

What is claimed is:

1. A superconductor tape comprising:
   a substrate;
   a buffer layer overlying the substrate; and
   a RE-Ba—Cu—O superconductor film overlying the buffer layer;
   wherein the superconductor film comprises $BaMO_3$, where M=Zr, Sn, Ta, Nb, Hf, or Ce, and which has a (101) peak of $BaMO_3$ elongated along an axis that is between 60° to 90° from an axis of the (001) peaks of the superconducting film.

2. The superconductor tape of claim 1, wherein the superconductor film comprises 5 to 30 mol % of dopant selected from the group consisting of Zr, Sn, Ta, Nb, Hf, Ce, and a combination thereof.

3. The superconductor tape of claim 1, wherein the superconductor film is defined as having a c-axis lattice constant higher than 11.74 Angstroms.

4. The superconductor tape of claim 1, wherein the superconductor film is over 10 meters in length.

5. The superconductor tape of claim 1, wherein the (101) peak of $BaMO_3$ is measured by Xray diffraction.

* * * * *

UNITED STATES PATENT AND TRADEMARK OFFICE
CERTIFICATE OF CORRECTION

PATENT NO. : 12,256,649 B2
APPLICATION NO. : 18/509125
DATED : March 18, 2025
INVENTOR(S) : Goran Majkic et al.

Page 1 of 1

It is certified that error appears in the above-identified patent and that said Letters Patent is hereby corrected as shown below:

In the Specification

Column 1, Line 20 - Replace:
"Office of Naval Research Award N00014-14-1-0182."

With:
--This invention was made with government support under grant number N00014-14-1-0182 awarded by the Office of Naval Research. The government has certain rights in the invention.--

Signed and Sealed this
Twenty-fourth Day of June, 2025

Coke Morgan Stewart
*Acting Director of the United States Patent and Trademark Office*